United States Patent
Keshtbod et al.

(10) Patent No.: US 10,008,540 B2
(45) Date of Patent: Jun. 26, 2018

(54) SPIN-ORBITRONICS DEVICE AND APPLICATIONS THEREOF

(71) Applicant: Avalanche Technology, Inc., Fremont, CA (US)

(72) Inventors: Parviz Keshtbod, Los Altos Hills, CA (US); Xiaobin Wang, Fremont, CA (US); Kimihiro Satoh, Fremont, CA (US); Zihui Wang, Milpitas, CA (US); Huadong Gan, Fremont, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days. days.

(21) Appl. No.: 15/586,638

(22) Filed: May 4, 2017

(65) Prior Publication Data

US 2017/0236868 A1 Aug. 17, 2017

Related U.S. Application Data

(62) Division of application No. 14/831,546, filed on Aug. 20, 2015, now Pat. No. 9,647,032.

(Continued)

(51) Int. Cl.
*H01L 27/22* (2006.01)
*H01L 43/08* (2006.01)

(52) U.S. Cl.
CPC ............ *H01L 27/228* (2013.01); *H01L 43/08* (2013.01)

(58) Field of Classification Search
CPC .................. H01L 27/228; H01L 43/08
See application file for complete search history.

(56) References Cited

U.S. PATENT DOCUMENTS

2011/0216580 A1* 9/2011 Berger .................... G11C 11/16
 365/158
2012/0068281 A1* 3/2012 Saida .................. G11C 11/1659
 257/421

(Continued)

OTHER PUBLICATIONS

Cubukcu et al., Spin-orbit torque magnetization switching of a three-terminal perpendicular magnetic tunnel junction, Applied Physics Letters, 2014, pp. 042406-1 to 042406-5, vol. 104.

(Continued)

*Primary Examiner* — Jay C Chang
*Assistant Examiner* — Mikka Liu
(74) *Attorney, Agent, or Firm* — Bing K. Yen

(57) ABSTRACT

The present invention is directed to a spin-orbitronics device including an array of MTJs with each of the MTJs coupled to a respective one of a plurality of selection transistors; a plurality of transverse polarizing lines with each of the transverse polarizing lines coupled to a row of the MTJs along a first direction; a plurality of word lines with each of the word lines coupled to gates of a row of the selection transistors along a second direction; and a plurality of source lines with each of the source lines coupled to a row of the selection transistors along a direction substantially perpendicular to the second direction. Each MTJ includes a magnetic comparison layer structure having a pseudo-invariable magnetization direction, which is configured to switch between two stable states by passing a comparison current through one of the plurality of transverse polarizing lines formed adjacent to the magnetic comparison layer structure.

15 Claims, 12 Drawing Sheets

Related U.S. Application Data

(60) Provisional application No. 62/042,623, filed on Aug. 27, 2014.

(56) References Cited

U.S. PATENT DOCUMENTS

| | | | |
|---|---|---|---|
| 2012/0155164 A1* | 6/2012 | Shukh | G11C 11/16 365/171 |
| 2014/0056061 A1* | 2/2014 | Khvalkovskiy | H01L 43/02 365/158 |
| 2014/0169088 A1 | 6/2014 | Buhrman et al. | |
| 2014/0269035 A1 | 9/2014 | Manipatruni et al. | |
| 2016/0042811 A1* | 2/2016 | Kwon | G11C 29/76 365/148 |

OTHER PUBLICATIONS

Mellnik et al., Spin-transfer torque generated by a topological insulator, Nature, Jul. 24, 2014, pp. 449-451, vol. 511.

Liu et al., Spin-torque switching with the giant spin hall effect of tantalum, Science, May 4, 2012, pp. 555-558, vol. 336.

Miron et al., Perpendicular switching of a single ferromagnetic layer induced by in-plane current injection, Nature, Aug. 11, 2011, pp. 189-193, vol. 476.

Avci, et al., Magnetization switching of an MgO/Co/Pt layer by in-plane current injection, Applied Physics Letters, 2012, pp. 212404-1 to 212404-3, vol. 100.

* cited by examiner

SPIN-ORBITRONICS DEVICE AND APPLICATIONS THEREOF

CROSS-REFERENCE TO RELATED APPLICATIONS

The present application is a divisional application of the commonly assigned application bearing Ser. No. 14/831,546 filed on Aug. 20, 2015 by Wang et al. and entitled "Spin-Orbitronics Device and Applications Thereof," which claims the benefit of the provisional application bearing Ser. No. 62/042,623 filed Aug. 27, 2014, entitled "Spin-Orbitronics Device and Applications Thereof." The contents of all of these applications, including their specifications, are incorporated herein by reference in their entirety.

BACKGROUND

The present invention relates to a spin-orbitronics device, and more particularly to a device whose operation is effectuated by spin transfer torque (STT) and spin-orbit interaction.

A magnetic tunnel junction (MTJ), which normally includes a magnetic free layer and a magnetic reference layer with an insulating tunnel junction layer interposed therebetween, serves as the memory element for a new class of non-volatile memory known as magnetic random access memory (MRAM). The magnetic reference layer has an invariable or fixed magnetization direction, while the magnetic free layer has a variable or switchable magnetization direction that is parallel or anti-parallel to that of the magnetic reference layer. When the magnetization directions of the magnetic free and reference layers are substantially parallel to each other, electrons polarized by the magnetic reference layer can tunnel through the insulating tunnel junction layer, thereby decreasing the electrical resistance of the MTJ. Conversely, the electrical resistance of the MTJ is high when the magnetization directions of the magnetic reference and free layers are substantially anti-parallel or opposite to each other. Accordingly, an MTJ has two stable resistance states that may be used as a memory element to store one bit of logical data.

Based on the relative orientation between the magnetic reference and free layers and the magnetization directions thereof, an MTJ can be classified into one of two types: in-plane MTJ, whose magnetization directions lie within planes substantially parallel to the same layers, or perpendicular MTJ, whose magnetization directions are substantially perpendicular to the layer planes.

The magnetization direction of the magnetic free layer and thus the resistance state of the MTJ may be switched by a spin-polarized electron flow that exerts a spin transfer torque on the magnetic free layer. FIGS. 1A and 1B illustrate switching of the magnetization direction of the magnetic free layer of a perpendicular MTJ 50. The perpendicular MTJ 50 includes a magnetic reference layer 52 having an invariable perpendicular magnetization direction 54 and a magnetic free layer 56 having a variable perpendicular magnetization direction 58 or 58' with an insulating tunnel junction layer 60 interposed therebetween. FIG. 1A illustrates switching of the magnetization direction 58 of the magnetic free layer 56 from anti-parallel to parallel configuration as a parallelizing electron flow 62 passes from the magnetic reference layer 52 to the magnetic free layer 56. As electrons pass through the magnetic reference layer 52 and are being spin-polarized, the spin-polarized electrons exert a spin transfer torque (STT) on the magnetic free layer 56, causing the magnetization direction 58 of the magnetic free layer 56 to switch from the anti-parallel to parallel configuration when the spin-polarized electron flow exceeds a threshold.

Conversely, FIG. 2B illustrates switching of the magnetization direction 58' of the magnetic free layer 56 from parallel to anti-parallel configuration as an anti-parallelizing electron flow 64 passes from the magnetic free layer 56 to the magnetic reference layer 52. As electrons pass through the magnetic free layer 56, the electrons with the same spin orientation as that of the magnetization in the magnetic reference layer 52 pass into the magnetic reference layer 52 unimpeded. However, the electrons with the opposite spin orientation are reflected back to the magnetic free layer 56 at the boundary between the tunnel junction layer 60 and the magnetic reference layer 52, causing the magnetization direction 58' of the magnetic free layer 56 to switch from parallel to anti-parallel configuration when the anti-parallelizing electron flow 64 exceeds a threshold level.

Similarly, FIGS. 2A and 2B illustrate switching of the magnetization direction of the magnetic free layer of an in-plane MTJ 66. The in-plane MTJ 66 includes a magnetic reference layer 68 having an invariable in-plane magnetization direction 70 and a magnetic free layer 72 having a variable in-plane magnetization direction 74 or 74' with an insulating tunnel junction layer 76 interposed therebetween. Like the perpendicular MTJ 50, the magnetization direction 74 of the magnetic free layer 72 may be switched to the parallel configuration by passing a parallelizing electron flow 78 from the magnetic reference layer 68 to the magnetic free layer 72 as shown in FIG. 2A. The magnetization direction 74' of the magnetic free layer 72 may be switched to the anti-parallel configuration by passing an anti-parallelizing electron flow 80 from the magnetic free layer 72 to the magnetic reference layer 68 as illustrated in FIG. 2B. The application of conventional MTJs, such as those shown in FIGS. 1A, 1B, 2A, and 2B, is mostly limited to non-volatile memory because of their limited capabilities.

Recently, several studies (see for example, Mellnik et al., *Nature*, 511, 449-451 (2014); Cubukcu et al., *Applied Physics Letters*, 104, 042406 (2014); Miron et al., *Nature*, 476, 189 (2011); Avci et al., *Applied Physics Letters*, 100, 212404 (2012); Liu et al., *Science*, 336, 555 (2012)) have demonstrated the switching of a magnetic free layer in contact with a non-magnetic heavy metal layer or a topological insulator layer by a spin-orbit torque generated when electrons are injected into the non-magnetic metal layer. Experimental evidence suggests that the injection of electrons generates a perpendicular spin current via spin-orbit interaction that transfers to the magnetization of the magnetic free layer to generate a spin torque and reverse the magnetization thereof. It is believed that the spin torque may be generated by spin Hall effect or Rashba-like interface effects or both. The devices proposed in the above-mentioned studies, however, can only switch the magnetic free layer. Therefore, like the conventional STT-MTJ described above, the applications of the proposed devices are limited to conventional memory devices with simple read and write functions.

For the foregoing reasons, there is a need for a spin-orbitronics device that can have additional functions and that can be inexpensively manufactured.

SUMMARY

The present invention is directed to a spin-orbitronics device that satisfies this need. A device having features of the present invention comprises a magnetic comparison layer structure having a pseudo-invariable magnetization direction; a magnetic free layer structure whose variable magnetization direction can be switched by a switching current passing between the magnetic comparison layer structure and the magnetic free layer structure; an insulating tunnel junction layer interposed between the magnetic comparison layer structure and the magnetic free layer structure; and a non-magnetic transverse polarizing layer formed adjacent to the magnetic comparison layer structure. The magnetic comparison layer structure may have a substantially higher coercivity than the magnetic free layer structure. The pseudo-invariable magnetization direction of the magnetic comparison layer structure may be switched by passing a comparison current through the transverse polarizing layer along a direction that is substantially parallel to the layer plane of the transverse polarizing layer. The pseudo-invariable magnetization direction of the magnetic comparison layer structure is not switched by the switching current. The variable magnetization direction of the magnetic free layer structure is not switched by the comparison current.

The non-magnetic transverse polarizing layer may be made of a metal or a topological insulator such as but not limited to antimony, bismuth selenide, bismuth telluride, antimony telluride, or any combination thereof.

The pseudo-invariable magnetization direction of the magnetic comparison layer structure and the variable magnetization direction of the magnetic free layer structure may both be oriented substantially perpendicular or parallel to layer planes thereof. For the case where both magnetization directions being substantially perpendicular to the layer planes thereof, the spin-orbitronics device may further include an optional magnetic field layer having an in-plane invariable magnetization direction formed adjacent to the transverse polarizing layer or separated from the magnetic free layer by a non-magnetic spacer layer.

According to another aspect of the present invention, a spin-orbitronics device comprises a magnetic reference layer structure having an invariable magnetization direction; a magnetic free layer structure whose variable magnetization direction can be switched by a switching current passing between the magnetic reference layer structure and the magnetic free layer structure; a first insulating tunnel junction layer interposed between the magnetic reference layer structure and the magnetic free layer structure; a second insulating tunnel junction layer formed adjacent to the magnetic free layer structure opposite the first insulating tunnel junction layer; a magnetic comparison layer structure having a pseudo-invariable magnetization direction formed adjacent to the second insulating tunnel junction layer; and a non-magnetic transverse polarizing layer formed adjacent to the magnetic comparison layer structure. The pseudo-invariable magnetization direction of the magnetic comparison layer structure may be switched by passing a comparison current through the transverse polarizing layer along a direction that is substantially parallel to the layer plane of the transverse polarizing layer.

The pseudo-invariable magnetization direction of the magnetic comparison layer structure, the variable magnetization direction of the magnetic free layer structure, and the invariable magnetization direction of the magnetic reference layer structure may all be oriented substantially perpendicular or parallel to layer planes thereof. For the case where all magnetization directions being substantially perpendicular to the layer planes thereof, the spin-orbitronics device may further include an optional magnetic field layer having an in-plane invariable magnetization direction formed adjacent to the transverse polarizing layer or separated from the magnetic reference layer by a non-magnetic spacer layer.

According to still another aspect of the present invention, a spin-orbitronics device comprises an array of magnetic tunnel junctions (MTJs) with each of the MTJs coupled to a respective one of a plurality of selection transistors; a plurality of transverse polarizing lines with each of the transverse polarizing lines coupled to a row of the MTJs along a first direction; a plurality of word lines with each of the word lines coupled to gates of a row of the selection transistors along a second direction; and a plurality of bit/source lines with each of the bit/source lines coupled to a row of the selection transistors along a direction that is substantially perpendicular to the second direction. The first direction and the second direction may be parallel or perpendicular to each other.

Each of the MTJs includes a magnetic comparison layer structure having a pseudo-invariable magnetization direction formed adjacent to a respective one of the transverse polarizing lines; a magnetic free layer structure whose variable magnetization direction can be switched by a switching current passing between the magnetic comparison layer structure and the magnetic free layer structure; and an insulating tunnel junction layer interposed between the magnetic comparison layer structure and the magnetic free layer structure. The pseudo-invariable magnetization direction of the magnetic comparison layer structure may be switched by passing a comparison current through the respective one of the transverse polarizing lines along a direction that is substantially parallel to the transverse polarizing lines. The pseudo-invariable magnetization direction of the magnetic comparison layer structure is not switched by the switching current. The variable magnetization direction of the magnetic free layer structure is not switched by the comparison current.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

Figure 1A:
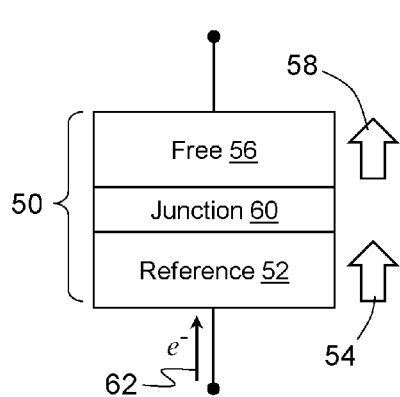
FIGS. 1A and 1B are schematic cross sectional views that illustrate switching of a conventional spin transfer torque MTJ with perpendicular magnetization.
Figure 1B:
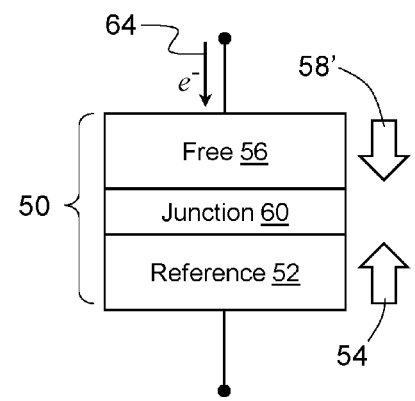
Figure 2A:
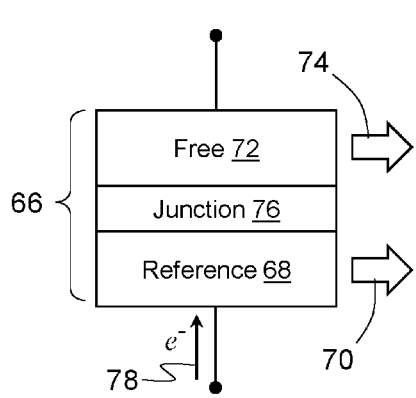
FIGS. 2A and 2B are schematic cross sectional views that illustrate switching of a conventional spin transfer torque MTJ with in-plane magnetization.
Figure 2B:
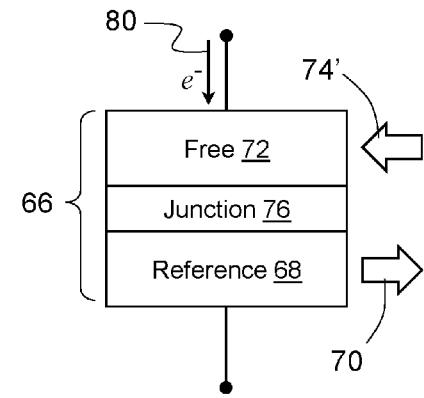

In the Summary above and in the Detailed Description, and the claims below, and in the accompanying drawings, reference is made to particular features (including method steps) of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

Where reference is made herein to a material AB composed of element A and element B, the material AB can be an alloy, a compound, or a combination thereof, except where the context excludes that possibility.

Where reference is made herein to a method comprising two or more defined steps, the defined steps can be carried out in any order or simultaneously except where the context excludes that possibility, and the method can include one or more other steps which are carried out before any of the defined steps, between two of the defined steps, or after all the defined steps except where the context excludes that possibility.

The term "noncrystalline" means an amorphous state or a state in which fine crystals are dispersed in an amorphous matrix, not a single crystal or polycrystalline state. In case of state in which fine crystals are dispersed in an amorphous matrix, those in which a crystalline peak is substantially not observed by, for example, X-ray diffraction can be designated as "noncrystalline."

The term "magnetic dead layer" means a layer of supposedly ferromagnetic material that does not exhibit a net magnetic moment in the absence of an external magnetic field. A magnetic dead layer of several atomic layers may form in a magnetic film in contact with another layer material owing to intermixing of atoms at the interface. Alternatively, a magnetic dead layer may form as thickness of a magnetic film decreases to a point that the magnetic film becomes superparamagnetic.

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "(a first number) to (a second number)" or "(a first number)–(a second number)," this means a range whose lower limit is the first number and whose upper limit is the second number. For example, "25 to 100 nm" means a range whose lower limit is 25 nm and whose upper limit is 100 nm.

Figure 3:
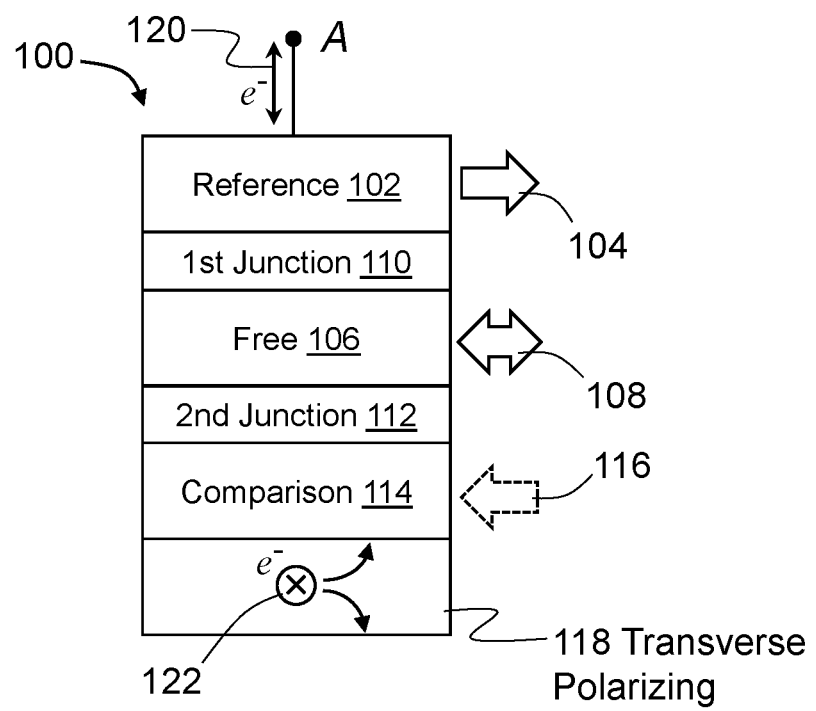
FIG. 3 is a schematic cross sectional view of a spin-orbitronics device with in-plane magnetization in accordance with an embodiment of the present invention.

An embodiment of the present invention as applied to a spin-orbitronics device will be described with reference to FIG. 3. The illustrated device 100 comprises a magnetic reference layer structure 102 having an invariable or fixed magnetization direction 104 and a magnetic free layer structure 106 having a variable or switchable magnetization direction 108 with a first insulating tunnel junction layer 110 interposed therebetween; a second insulating tunnel junction layer 112 formed adjacent to the magnetic free layer structure 106 opposite the first insulating tunnel junction layer 110; a magnetic comparison layer structure 114 having a pseudo-invariable or pseudo-fixed magnetization direction 116 formed adjacent to the second insulating tunnel junction layer 112 opposite the magnetic free layer structure 106; and a non-magnetic transverse polarizing layer 118 formed adjacent to the magnetic comparison layer structure 114 opposite the second insulating tunnel junction layer 112. The non-magnetic transverse polarizing layer 118 may extend along a direction that is parallel to the layer plane thereof, thereby forming a line. The layer stacking order of the device 100 as illustrated in FIG. 3 may be inverted without affecting the function thereof.

All magnetization directions 104, 108, and 116 lie in planes that are substantially parallel to the magnetic layer structures 102, 106, and 114. The variable in-plane magnetization direction 108 of the magnetic free layer structure 106 may be switched by passing an electron flow 120 between the magnetic reference layer structure 102 and the magnetic comparison layer structure 114. The pseudo-invariable magnetization direction 116 of the magnetic comparison layer structure 114 remains fixed during switching of the variable magnetization direction 108 of the magnetic free layer structure 106 by the switching electron flow 120. Therefore, the magnetic comparison layer structure 114 may function as a second magnetic reference layer, resulting in a structure comprising two MTJs sharing a magnetic free layer structure. The magnetic reference layer structure 102, the first insulating junction layer 110, and the magnetic free layer structure 106 would form a first MTJ, while the magnetic free layer structure 106, the second insulating tunnel junction layer 112, and the magnetic comparison layer structure 114 would form a second MTJ. In an embodiment, both MTJs cooperatively provide dual spin transfer torque to switch the variable magnetization direction 108 of the magnetic free layer structure 106. Therefore, the pseudo-invariable magnetization direction 116 of the magnetic comparison layer structure 114 may be oriented parallel or anti-parallel to the invariable magnetization direction 104 of the magnetic reference layer structure 102, depending on the configuration of the magnetic free layer structure 106, especially the number of anti-ferromagnetic coupling layers within the magnetic free layer structure 106. If the magnetic free layer structure 106 is made of a single magnetic layer or has a composite structure with even numbers of anti-ferromagnetic coupling layers therein, then the pseudo-invariable magnetization direction 116 of the magnetic comparison layer structure 114 may be oriented anti-parallel to the invariable magnetization direction 104 of the magnetic reference layer structure 102. Otherwise, the two magnetic directions 104 and 116 may be parallel to each other. The magnetic comparison layer structure 114 preferably has a higher coercivity than the magnetic free layer structure 106 to prevent the switching of the pseudo-invariable magnetization direction 116 when the switching electron flow 120 passes through the device 100. In another embodiment, the second MTJ that incorporates the second insulating tunnel junction layer 112 has a higher resistance·area value (RA) and a higher TMR ratio than the first MTJ.

The pseudo-invariable magnetization direction 116 of the magnetic comparison layer structure 114 may be switched by passing a comparison electron flow 122 through the transverse polarizing layer 118 along a direction substantially parallel to the layer plane of the layer 118. Without being bound to any theory, it is believed that the switching of the pseudo-invariable magnetization direction 116 by the comparison electron flow 122 that travels on a plane substantially parallel to the layer plane of the transverse polarizing layer 118 is accomplished by the coupling of the charge and spin currents owing to spin-orbit interaction. As the comparison electron flow 122 passes through the transverse polarizing layer 118, electrons with opposite spin directions diverge and accumulate on top and bottom surfaces of the transverse polarizing layer 118, thereby imparting a spin transfer torque on the magnetic comparison layer structure 114 to switch the pseudo-invariable magnetization direction 116 thereof. The pseudo-invariable magnetization direction 116 may be switched in both directions by changing the direction of the comparison electron flow 122.

The non-magnetic transverse polarizing layer 118 may be made of a heavy metal, such as but not limited to tungsten (W), tantalum (Ta), hafnium (Hf), platinum (Pt), gold (Au), iridium (Ir), rhenium (Re), or any combination thereof. Alternatively, the non-magnetic transverse polarizing layer 118 may be made of a topological insulator, such as but not limited to antimony (Sb), bismuth selenide ($Bi_2Se_3$), bismuth telluride ($Bi_2Te_3$), antimony telluride ($Sb_2Te_3$), lead bismuth telluride ($PbBi_2Te_4$), lead antimony telluride ($PbSb_2Te_4$), or any combination thereof.

One or more of the magnetic reference, free, and comparison layer structures 102, 106, and 114 may be made of a single magnetic layer comprising at least one ferromagnetic element, such as but not limited to cobalt (Co), nickel (Ni), or iron (Fe), to form a magnetic material, such as but not limited to Co, Ni, Fe, CoNi, CoFe, NiFe, or CoNiFe. The magnetic material of the one or more of the magnetic layer structures 102, 106, and 114 may further include at least one non-magnetic element, such as but not limited to boron (B), titanium (Ti), zirconium (Zr), hafnium (Hf), vanadium (V), niobium (Nb), tantalum (Ta), chromium (Cr), molybdenum (Mo), tungsten (W), aluminum (Al), silicon (Si), germanium (Ge), gallium (Ga), oxygen (O), nitrogen (N), carbon (C), platinum (Pt), palladium (Pd), ruthenium (Ru), samarium (Sm), neodymium (Nd), or phosphorus (P), to form a magnetic alloy or compound, such as but not limited to cobalt-iron-boron (CoFeB), cobalt-iron-boron-titanium (CoFeBTi), cobalt-iron-boron-zirconium, (CoFeBZr), cobalt-iron-boron-hafnium (CoFeBHf), cobalt-iron-boron-vanadium (CoFeBV), cobalt-iron-boron-tantalum (CoFeBTa), cobalt-iron-boron-chromium (CoFeBCr), cobalt-iron-titanium (CoFeTi), cobalt-iron-zirconium (CoFeZr), cobalt-iron-hafnium (CoFeHf), cobalt-iron-vanadium (CoFeV), cobalt-iron-niobium (CoFeNb), cobalt-iron-tantalum (CoFeTa), cobalt-iron-chromium (CoFeCr), cobalt-iron-molybdenum (CoFeMo), cobalt-iron-tungsten (CoFeW), cobalt-iron-aluminum (CoFeAl), cobalt-iron-silicon (CoFeSi), cobalt-iron-germanium (CoFeGe), iron-zirconium-boron (FeZrB), samarium-cobalt (SmCo), neodymium-iron-boron (NdFeB), or cobalt-iron-phosphorous (CoFeP).

One or more of the magnetic layer structures 102, 106, and 114 may alternatively have a multilayer structure formed by interleaving layers of a first type of material with layers of a second type of material to form n number of stacks of a unit bilayer structure made of the two types of materials, where n is an integer greater or equal to 1. At least one of the two types of materials is magnetic. The multilayer structure, which is denoted by [first type material/second type material]$_n$, may be any suitable magnetic multilayer structure, such as but not limited to [Co/Pt]$_n$, [Co/Pd]$_n$, [Co/Ni]$_n$, [CoFe/Pt]$_n$, [CoFe/Pd]$_n$, [CoFe/Ni]$_n$, or [Co/Pt (Pd)]$_n$. The multilayer structure of the magnetic layer structures 102, 106, and 114 may or may not exhibit the characteristic satellite peaks associated with superlattice when analyzed by X-ray or neutron diffraction.

Figure 4A:
FIGS. 4A-4D are schematic cross sectional views of various structural embodiments of the present invention as applied to a magnetic layer structure.
Figure 4B:
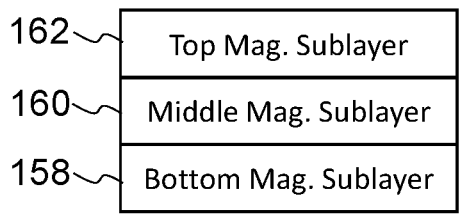
Figure 4C:
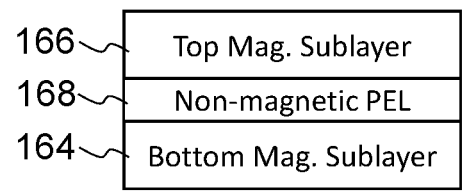
Figure 4D:
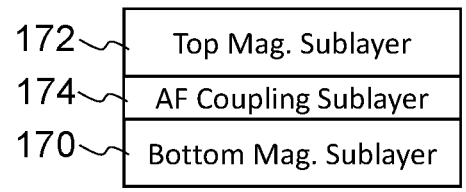

Still alternatively, one or more of the magnetic layer structures 102, 106, and 114 may comprise two or more magnetic sublayers. In an embodiment, one or more of the magnetic layer structures 102, 106, and 114 have a bilayer structure comprising a bottom magnetic sublayer 154 and a top magnetic sublayer 156 as illustrated in FIG. 4A. In another embodiment, one or more of the magnetic layer structures 102, 106, and 114 have a trilayer structure comprising a bottom magnetic sublayer 158, a middle magnetic sublayer 160, and a top magnetic sublayer 162 as illustrated in FIG. 4B. In still another embodiment, one or more of the magnetic layer structures 102, 106, and 114 has a trilayer structure comprising a bottom magnetic sublayer 164 and a top magnetic sublayer 166 with a non-magnetic perpendicular enhancement sublayer 168 interposed therebetween as illustrated in FIG. 4C. In yet another embodiment, one or more of the magnetic layer structures 102, 106, and 114 has a trilayer structure comprising a bottom magnetic sublayer 170 and a top magnetic sublayer 172 with a non-magnetic anti-ferromagnetic coupling sublayer 174 interposed therebetween as illustrated in FIG. 4D. Accordingly, the bottom and top magnetic sublayers 170 and 172 have opposite magnetization directions. One or more of the magnetic sublayers 154-174 may be made of any suitable magnetic material, including alloy, compound, or multilayer structure, as described for the magnetic layer structures 102, 106, and 114 in the preceding paragraphs above. The non-magnetic perpendicular enhancement sublayer 168 may be made of any suitable material, such as but not limited to tantalum (Ta), ruthenium (Ru), tungsten (W), magnesium oxide (MgO), hafnium (Hf), zirconium (Zr), niobium (Nb), molybdenum (Mo), chromium (Cr), or any combination thereof. The anti-ferromagnetic coupling sublayer 174 may be made of any suitable material, such as but not limited to ruthenium (Ru), rhodium (Rh), iridium (Ir), copper (Cu), rhenium (Re), chromium (Cr), vanadium (V), molybdenum (Mo), tungsten (W), niobium (Nb), or tantalum (Ta), or any combination thereof.

The first and second insulating tunnel junction layers 110 and 112 have energy barriers through which electrons can pass by tunnel effect. One or both of the junction layers 110 and 112 may be made of any suitable insulating material, such as but not limited to magnesium oxide (MgO), aluminum oxide (AlOx), or any combination thereof.

Operation of the spin-orbitronics device 100 will now be described with continuing reference to FIG. 3. During the normal data-writing process, the switching electron flow 120 is passed through the layers 102, 106, and 110-114 to switch the variable magnetization direction 108 of the magnetic free layer structure 106, while the invariable magnetization direction 104 and the pseudo-invariable magnetization direction 116 of the magnetic reference and comparison layer structures 102 and 114, respectively, are held fixed. An electron flow passing through the transverse polarizing layer 118 like the comparison electron flow 122 may be used to pin the pseudo-invariable magnetization direction 116 of the magnetic comparison layer structure 114 during the writing process if the coercivity thereof is not sufficiently high.

The spin-orbitronics device 100 may be used as a memory element with self-reference capability. The self-reference read process begins by switching the pseudo-invariable magnetization direction 116 of the magnetic comparison layer structure 114 to a first direction by sending a current or electron flow 122 through the transverse polarizing layer 118 along a direction substantially parallel to the layer plane of the layer 118. The voltage dropped across the device 100 is measured by passing a read current through the stack of layers 102, 106, and 110-114. The electron flow 122 is then reversed to switch the pseudo-invariable magnetization direction 116 to a second direction opposite to the first direction. The voltage dropped across the device 100 is measured again and compared to the previous value prior to reversing the electron flow 122 in order to determine the relative orientation of the variable magnetization direction 108 of the magnetic free layer 106 to the invariable and pseudo-invariable magnetization directions 104 and 116.

Alternatively, the spin-orbitronics device 100 may operate as an element of a content addressable memory (CAM) by first writing data to the magnetic free layer 106 with the variable magnetization direction 108 thereof oriented in a first direction as described above. A comparison electron flow 122 is then passed through the transverse polarizing layer 118 to orient the pseudo-invariable magnetization direction 116 of the magnetic comparison layer structure 114 along a direction corresponding to the comparison data. The voltage drop across the device 100 is measured by passing a read current or electron flow through the stack of layers 102, 106, and 110-114 to determine whether the variable magnetization direction 108 and the pseudo-invariable magnetization direction 116 are parallel or anti-parallel to each other after the passage of the comparison electron flow 122.

Another embodiment of the present invention as applied to a spin-orbitronics device will be described with reference to FIG. 5. The illustrated device 200 comprises a magnetic free layer structure 202 having a variable or switchable magnetization direction 204 and a magnetic comparison layer structure 206 having a pseudo-invariable or pseudo-fixed magnetization direction 208 with an insulating tunnel junction layer 210 interposed therebetween; and a non-magnetic transverse polarizing layer 212 formed adjacent to the magnetic comparison layer structure 206 opposite the insulating tunnel junction layer 210. The non-magnetic transverse polarizing layer 212 may extend along a direction that is parallel to the layer plane thereof, thereby forming a line. All magnetization directions 204 and 208 lie in planes substantially parallel to the magnetic layer structures 202 and 206. The layer stacking order of the device 200 as illustrated in FIG. 5 may be inverted without affecting the function thereof.

Figure 5:
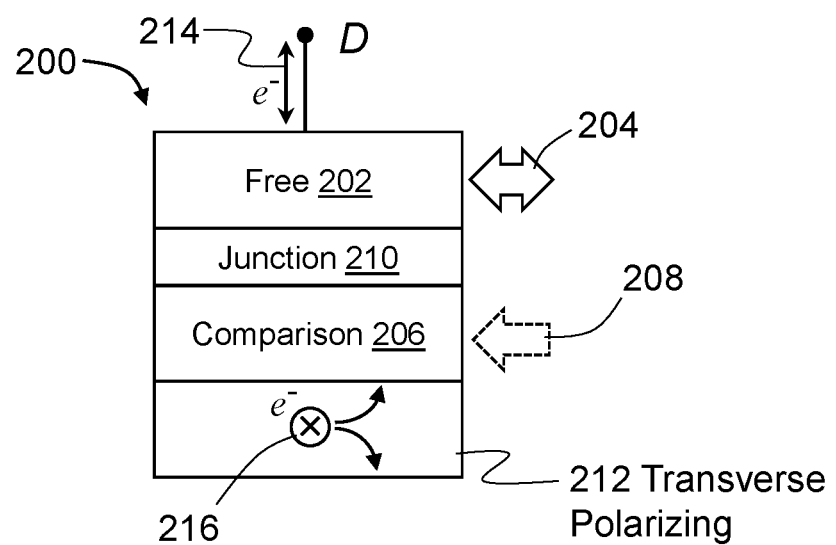
FIG. 5 is a is a schematic cross sectional view of a spin-orbitronics device with in-plane magnetization in accordance with another embodiment of the present invention.

The device 200 of FIG. 5 is similar to the device 100 of FIG. 3 except for lacking a magnetic reference layer structure and one of the two insulating tunnel junction layers. The magnetic comparison layer structure 206 of the device 200 functions as a "reference" layer and a "comparison" layer. The device 200 may be similarly operated as the device 100 of FIG. 3 as described above. The variable magnetization direction 204 of the magnetic free layer structure 202 may be switched by passing a switching electron flow 214 between the magnetic free layer structure 202 and the magnetic comparison layer structure 206. The magnetic comparison layer structure 206 preferably has a higher coercivity than the magnetic free layer structure 202 to prevent the switching of the pseudo-invariable magnetization direction 208 when the switching electron flow 214 passes through the device 200. An electron flow passing through the transverse polarizing layer 212 like the comparison electron flow 216 may be used to pin the pseudo-invariable magnetization direction 208 of the magnetic comparison layer structure 206 during the writing process if the coercivity thereof is not sufficiently high. The pseudo-invariable magnetization direction 208 of the magnetic comparison layer structure 206 may be switched by passing a comparison electron flow 216 through the transverse polarizing layer 212 along a direction that is substantially parallel to the layer 212.

The magnetic free layer structure 202 and the magnetic comparison layer structure 206 may have any suitable structure or may be made of any suitable material as described above for the magnetic layer structures 102, 106, and 114. Likewise, the insulating tunnel junction layer 210 and the transverse polarizing layer 212 may be made of any suitable material as described above.

Still another embodiment of the present invention as applied to a spin-orbitronics device will be described with reference to FIGS. 6A and 6B. The illustrated devices 300 and 300' each comprises a magnetic reference layer structure 302 having an invariable or fixed magnetization direction 304 and a magnetic free layer structure 306 having a variable or switchable magnetization direction 308 with a first insulating tunnel junction layer 310 interposed therebetween; a second insulating tunnel junction layer 312 formed adjacent to the magnetic free layer structure 306 opposite the first insulating tunnel junction layer 310; a magnetic comparison layer structure 314 having a pseudo-invariable or pseudo-fixed magnetization direction 316 formed adjacent to the second insulating tunnel junction layer 312 opposite the magnetic free layer structure 306; and a non-magnetic transverse polarizing layer 318 formed adjacent to the magnetic comparison layer structure 314 opposite the second insulating tunnel junction layer 312. The non-magnetic transverse polarizing layer 318 may extend along a direction that is parallel to the layer plane thereof, thereby forming a line. All magnetization directions 304, 308, and 316 are substantially perpendicular to the layer planes of the magnetic layers 302, 306, and 314. In an embodiment, the coercivity of the magnetic comparison layer structure 314 is substantially higher than that of the magnetic free layer structure 306.

The device 300 may optionally include a magnetic field layer structure 320 having an in-plane invariable magnetization direction 322 separated from the magnetic reference layer structure 302 by a non-magnetic spacer layer 323. The optional magnetic field layer structure 320 may alternatively be disposed adjacent to the transverse polarizing layer 318 opposite the magnetic comparison layer structure 314 as illustrated in FIG. 6B. The main function of the magnetic field layer structure 320 is to provide an in-plane magnetic field to the magnetic comparison layer structure 314 to facilitate the switching of the pseudo-invariable magnetization direction 316 upon passage of a comparison electron flow 324. The layer stacking order of the devices 300 and 300' as illustrated in FIGS. 6A and 6B may be inverted without affecting the function thereof.

Figure 6A:
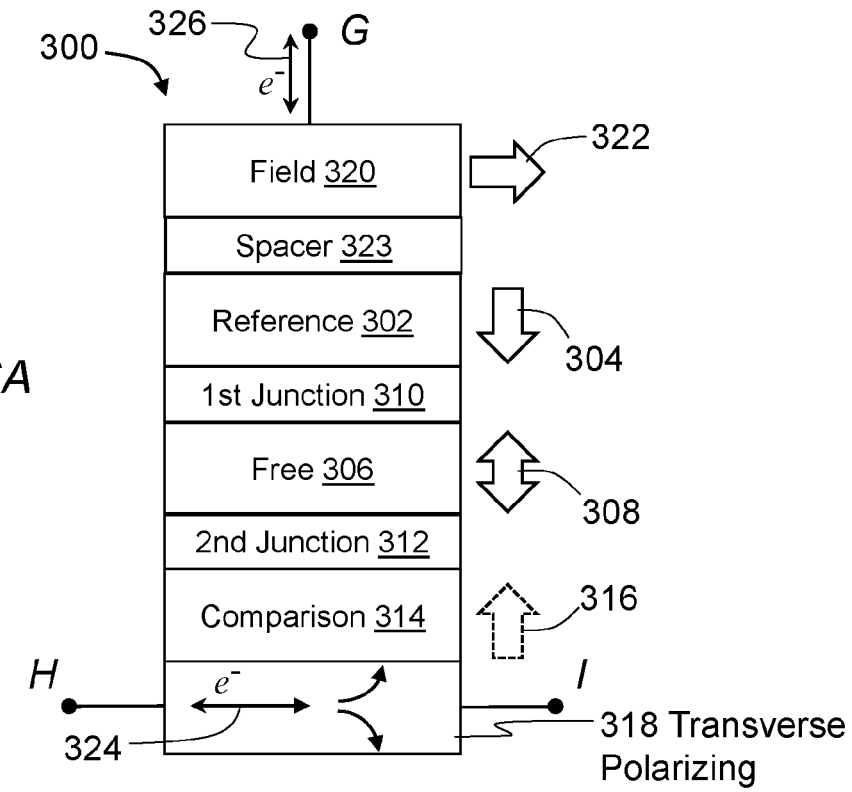
FIGS. 6A and 6B are schematic cross sectional views of spin-orbitronics devices with perpendicular magnetization in accordance with embodiments of the present invention.
Figure 6B:
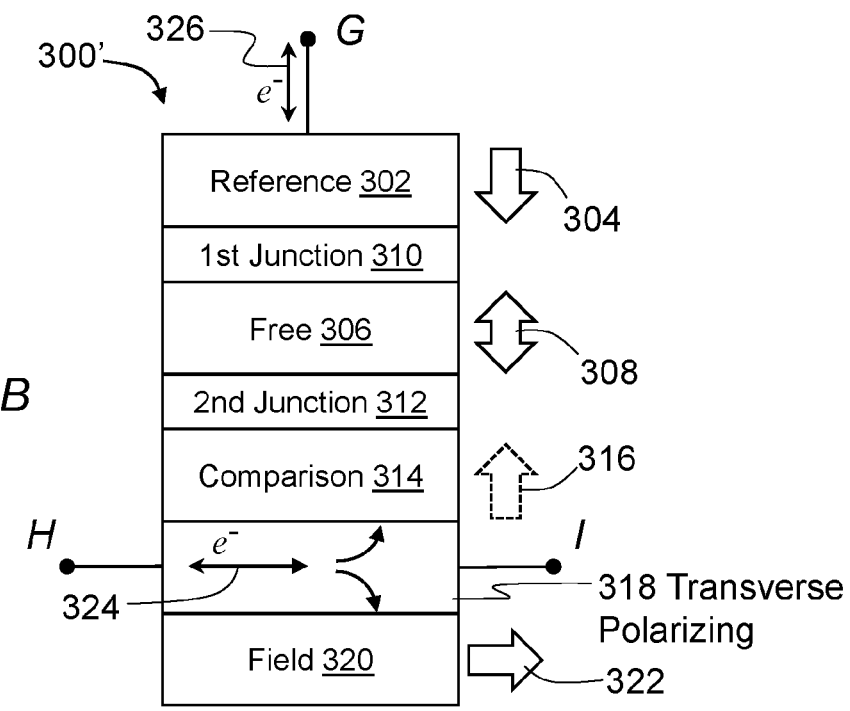

The devices 300 and 300' of FIGS. 6A and 6B are similar to the device 100 of FIG. 3 except the magnetization directions 304, 308, and 316 are oriented perpendicularly to the layer planes of the magnetic layers 302, 306, and 314. Like the device 100 of FIG. 3, the pseudo-invariable magnetization direction 316 of the magnetic comparison layer structure 314 may be oriented parallel or anti-parallel to the invariable magnetization direction 304 of the magnetic reference layer structure 302, depending on the configuration of the magnetic free layer structure 306, especially the number of anti-ferromagnetic coupling layers, if any, within the magnetic free layer structure 306. If the magnetic free layer structure 306 is made of a single magnetic layer or has a composite structure with even numbers of anti-ferromagnetic coupling layers therein, then the pseudo-invariable magnetization direction 316 of the magnetic comparison layer structure 314 may be oriented anti-parallel to the invariable magnetization direction 304 of the magnetic reference layers 302. Otherwise, the two magnetic directions 304 and 316 may be parallel to each other.

The magnetic reference layer structure 302, the magnetic free layer structure 306, the magnetic comparison layer structure 314, and the magnetic field layer structure 320 may have any suitable structure or may be made of any suitable material as described above for the magnetic layer structures 102, 106, and 114. Likewise, the insulating tunnel junction layers 310, 312 and the transverse polarizing layer 318 may be made of any suitable material as described above. The non-magnetic spacer layer 323 may be made of any suitable material, such as but not limited to titanium (Ti), zirconium (Zr), hafnium (Hf), vanadium (V), niobium (Nb), tantalum (Ta), chromium (Cr), molybdenum (Mo), tungsten (W), rhodium (Rh), palladium (Pd), platinum (Pt), copper (Cu), silver (Ag), ruthenium (Ru), titanium nitride (TiN), zirconium nitride (ZrN), hafnium nitride (HfN), tantalum nitride (TaN), magnesium oxide (MgO), aluminum oxide ($AlO_x$), or any combination thereof.

Operation of the devices 300 and 300' is similar to that of the device 100 of FIG. 3 as described above. The variable magnetization direction 308 of the magnetic free layer structure 306 may be switched by passing a switching current or electron flow 326 between the magnetic reference layer structure 302 and the magnetic comparison layer structure without switching the pseudo-invariable magnetization direction 316. The pseudo-invariable magnetization direction 316 of the magnetic comparison layer structure 314 may be switched by passing the comparison electron flow 324 through the transverse polarizing layer 318 along a direction (between Nodes H and I) that is substantially parallel to the layer 318.

A "self-reference" read operation may be carried out using the device of 300 or 300' by first measuring the voltage drop across the device. An electron flow that rotates the pseudo-invariable magnetization direction 316 away from the vertical position but not sufficient to rotate the pseudo-invariable magnetization direction 316 to the opposite direction is passed through the transverse polarizing layer 318, while the voltage drop across the device is measured again and compared to the initial value. A voltage increase means the memory cell was originally in the low resistance state. Conversely, a voltage decrease means the memory cell was originally in the high resistance state. The "self-reference" read operation does not need to fully rotate the pseudo-invariable magnetization direction 316 of the magnetic comparison layer structure 314. Therefore, there is no need to reset the magnetic comparison layer structure 314. While the "self-reference" read method may be used for all embodiments of devices 300 and 300', it is particularly suitable for embodiments without the magnetic field layer structure 320 that facilitates the switching of the pseudo-invariable magnetization direction 316.

Yet another embodiment of the present invention as applied to a spin-orbitronics device will be described with reference to FIGS. 7A and 7B. The illustrated devices 400 and 400' each comprises a magnetic free layer structure 402 having a variable or switchable magnetization direction 404 and a magnetic comparison layer structure 406 having a pseudo-invariable or pseudo-fixed magnetization direction 408 with an insulating tunnel junction layer 410 interposed therebetween; and a transverse polarizing layer 412 formed adjacent to the magnetic comparison layer structure 406 opposite the insulating tunnel junction layer 410. The non-magnetic transverse polarizing layer 412 may extend along a direction that is parallel to the layer plane thereof, thereby forming a line. All magnetization directions 404 and 408 are substantially perpendicular to the layer planes of the magnetic layer structures 402 and 406. In an embodiment, the magnetic comparison layer structure 406 has a higher coercivity than the magnetic free layer structure 402.

Figure 7A:
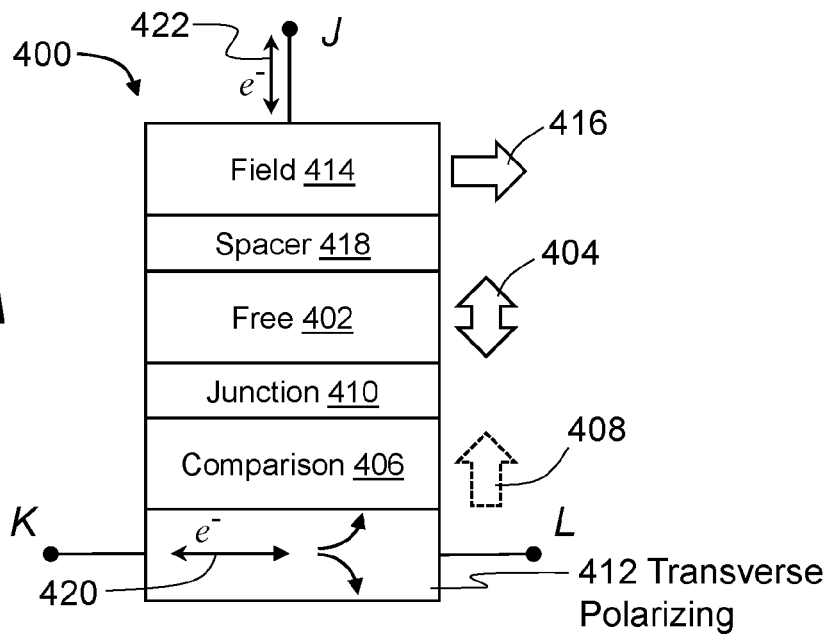
FIGS. 7A and 7B are schematic cross sectional views of spin-orbitronics devices with perpendicular magnetization in accordance with other embodiments of the present invention.

The device 400 of FIG. 7A may optionally include a magnetic field layer structure 414 having an in-plane invariable magnetization direction 416 separated from the magnetic free layer structure 402 by a non-magnetic spacer layer 418. The optional magnetic field layer structure 414 may alternatively be disposed adjacent to the transverse polarizing layer 412 opposite the magnetic comparison layer structure 406 as illustrated in FIG. 7B. The main function of the magnetic field layer structure 414 is to provide an in-plane magnetic field to the magnetic comparison layer structure 406 to facilitate the switching of the pseudo-invariable magnetization direction 408 upon passage of a comparison electron flow 420. The layer stacking order of the devices 400 and 400' as illustrated in FIGS. 7A and 7B may be inverted without affecting the function thereof.

Figure 7B:
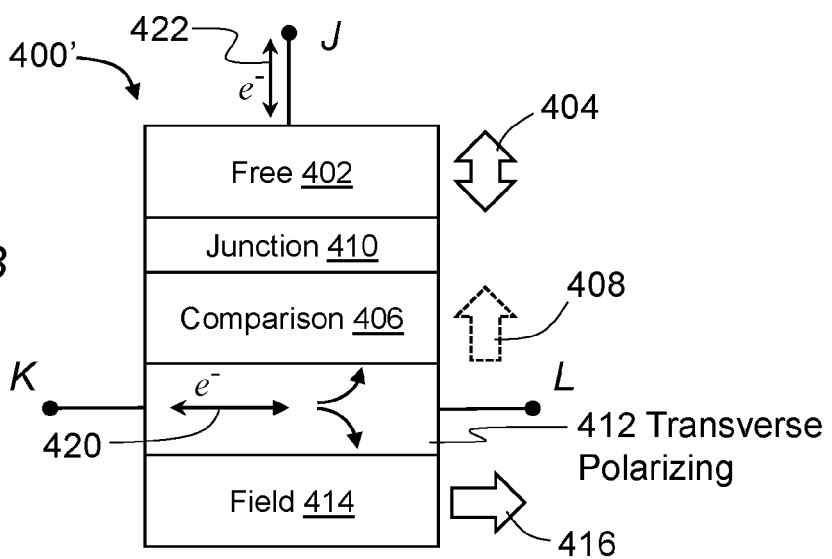

The devices 400 and 400' of FIGS. 7A and 7B are similar to the devices 300 and 300' of FIGS. 6A and 6B except for lacking a magnetic reference layer structure and one of the two insulating tunnel junction layers. The magnetic comparison layer structure 406 of the devices 400 and 400' functions as a "reference" layer and a "comparison" layer. The devices 400 and 400' may be similarly operated as the device 100 of FIG. 3 as described above. The variable magnetization direction 404 of the magnetic free layer structure 402 may be switched by passing a switching electron flow 422 between the magnetic free layer structure 402 and the magnetic comparison layer structure 406 without switching the pseudo-invariable magnetization direction 408. The pseudo-invariable magnetization direction 408 of the magnetic comparison layer structure 406 may be switched by passing the comparison electron flow 420 through the transverse polarizing layer 412 along a direction (between Nodes K and L) that is substantially parallel to the layer 412. Like the devices of 300 and 300', the devices of 400 and 400', especially for embodiments without the magnetic field layer structure 414, may operate in the "self-reference" read mode as described above.

The magnetic free layer structure 402, the magnetic comparison layer structure 406, and the magnetic field layer structure 414 may have any suitable structure or may be made of any suitable material as described above for the magnetic layer structures 102, 106, and 114. Likewise, the insulating tunnel junction layer 410, the transverse polarizing layer 412, and the non-magnetic spacer layer 418 may be made of any suitable material as described above.

Application of the spin-orbitronics devices to a content addressable memory (CAM) will now be discussed with reference to FIG. 8, which is a schematic diagram of a CAM device 600. When a given word or a string of data bits are compared to all words stored in a CAM device, the address of the matched word becomes the output of the CAM device. A conventional CAM device normally includes a memory array and a comparison circuitry. The CAM device 600 of the present invention uses an array of spin-orbitronics device likes those described above to perform both storage and logic operations.

Figure 8:
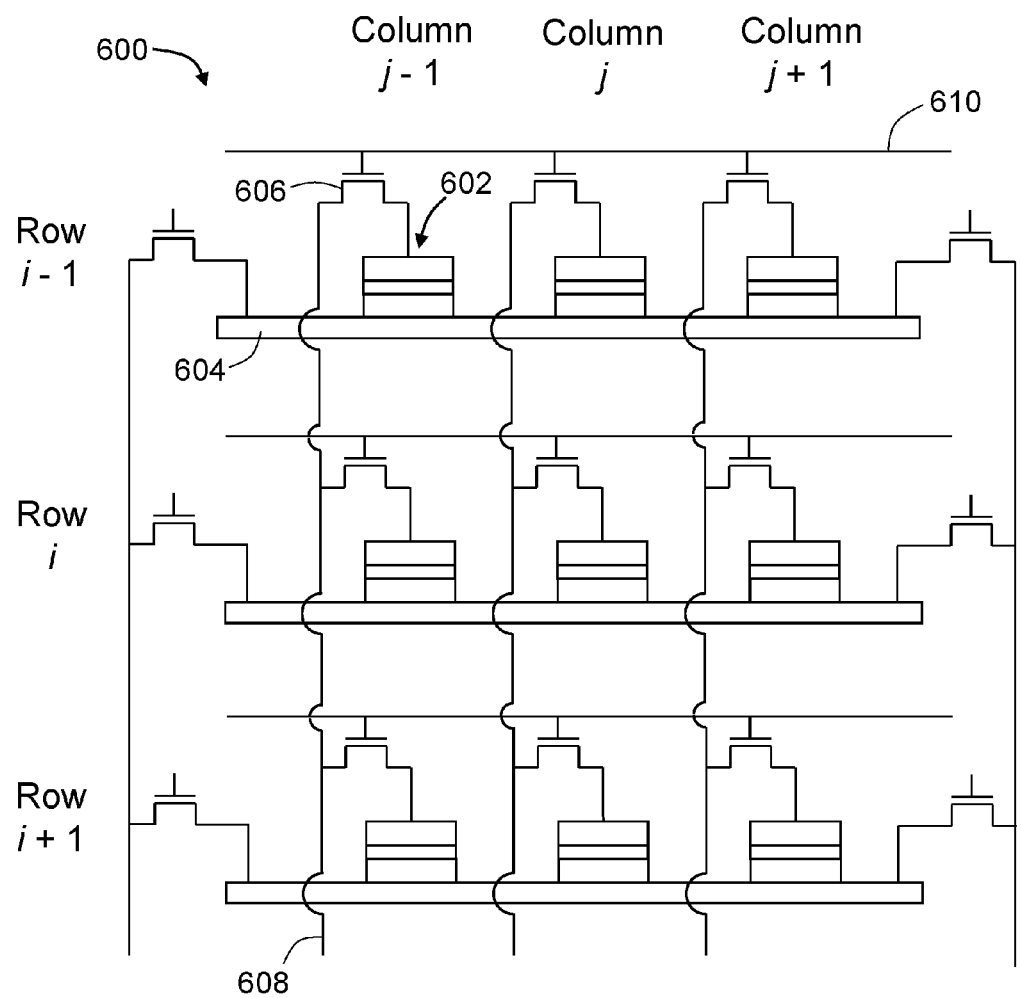
FIG. 8 is a schematic view of a CAM device incorporating an array of spin-oribitronics devices in accordance with an embodiment of the present invention.

The CAM device 600 of FIG. 8 comprises an array of magnetic tunnel junctions (MTJs) 602 arranged in rows and columns with each row of MTJs 602 coupled to one of a plurality of transverse polarizing lines 604 that may also function as a bit or source line; an array of transistors 606 arranged in rows and columns with each column of transistors 606 coupled to one of a plurality of bit/source lines 608 at one end and a respective column of MTJs 602 at the other end; and a plurality of word lines 610 with each word line couples to gates of a respective row of transistors 606. Each of the MTJs 602 includes a magnetic free layer structure, an insulating tunnel junction layer, and a magnetic comparison layer structure coupled to a respective one of the transverse polarizing lines 604 as shown in FIGS. 5, 7A, and 7B. Each of the MTJs 602 may further include other layers, such as a magnetic reference structure separated from the magnetic free layer structure by a second insulating tunnel junction layer as illustrated in FIGS. 3, 6A, and 6B. The magnetic layers may have in-plane magnetization (FIGS. 3 and 5) or perpendicular magnetization (FIGS. 6A, 6B, 7A, and 7B). For perpendicularly magnetized MTJs, an optional magnetic field layer may be included to facilitate switching of the magnetic comparison layer structure as shown in FIGS. 6A, 6B, 7A, and 7B.

Figure 9:
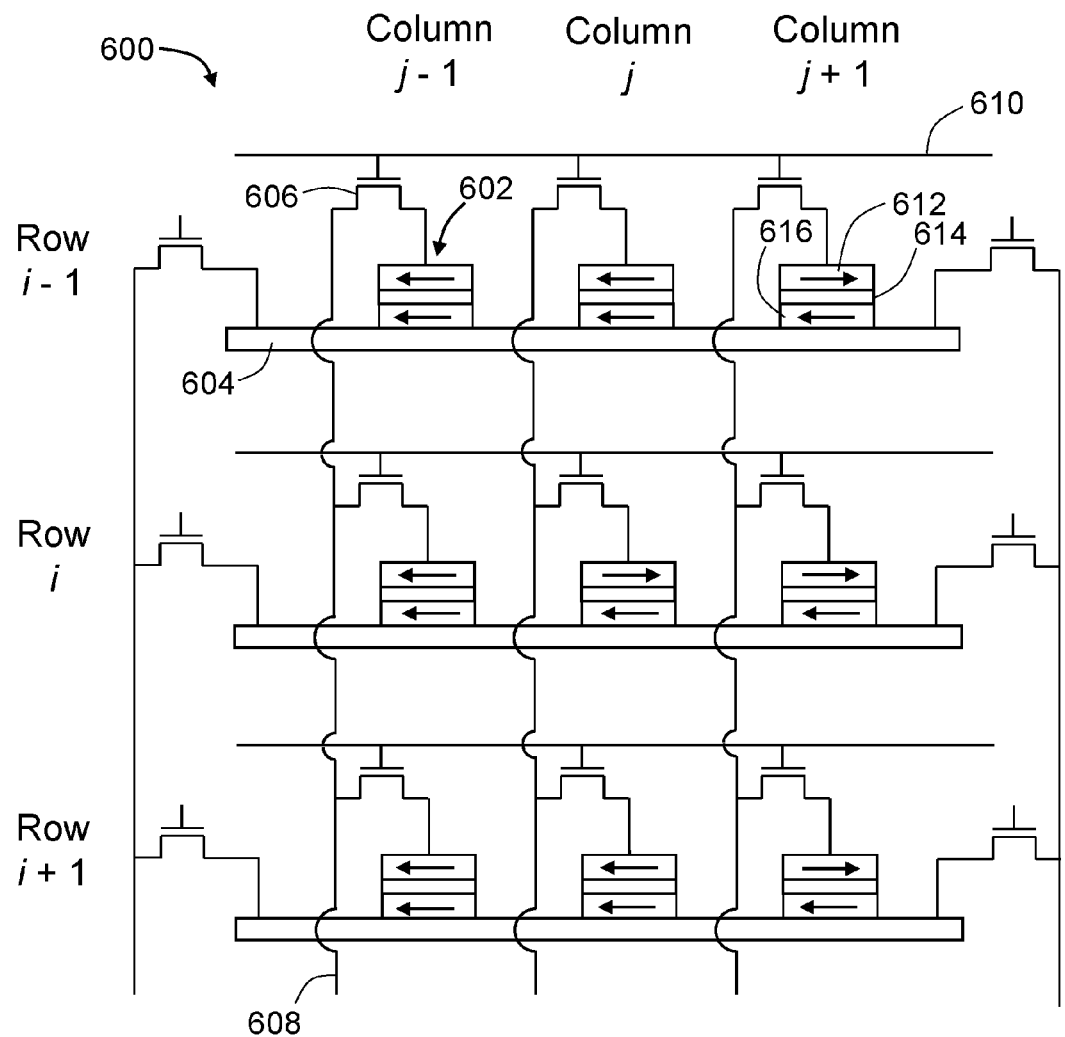
FIG. 9 is a schematic view of the CAM device of FIG. 8 showing an exemplary magnetization configuration.

Operation of the CAM device 600 will now be described with continuing reference to FIG. 9, which shows 3 columns and 3 rows of memory cells for illustration purpose with each memory cell comprising one of the MTJs 602 and a respective one of the transistors 606 coupled thereto. However, it should be understood that the CAM device 600 may have as many rows or columns of memory cells as needed. For searching a word comprising 8 bit of data, for example, the CAM device would need 8 rows of memory cells. Likewise, a search word or string comprising 16, 32, and 64 bit of data would require 16, 32, and 64 rows of memory cells, respectively. Each column of the memory cells can store one word of data. Therefore, a storage capacity of 128 words would require 128 columns of memory cells.

The CAM device 600 may operate in three modes: reading, writing, and comparing. Data can be read from or written to a memory cell of the CAM device 600 by selecting one of the word lines 610 and one of the bit/source lines 608. Each of the MTJs 602 in FIG. 9 comprises a magnetic free layer structure 612, an insulating tunnel junction layer 614, and a magnetic comparison layer structure 616 that is coupled to a respective one of the transverse polarizing lines 604, much like the device 200 of FIG. 5. It should be noted, however, that device 200 is used here for illustration purpose and that other devices 100, 300, 300', 400, and 400' may also be used instead. The data is stored in the magnetic free layer structure 612 in the form of magnetization direction. When the magnetization directions of the magnetic free layer structure 612 and the magnetic comparison layer structure 616 are oriented in substantially the same direction, the resistance of the MTJ is low. Conversely, the resistance of the MTJ is high when the magnetization directions are substantially opposite to each other. Prior to the comparison operation, the magnetization direction of the magnetic comparison layer structure 616 for all MTJs 602 is oriented to a same direction, say pointed to the left. Accordingly, words in the form of (i−1, 1, i+1) stored in columns j−1, j, and j+1 would be (000), (010), and (111) assuming the low and high resistance states correspond to the logical states of "0" and "1", respectively.

Figure 10:
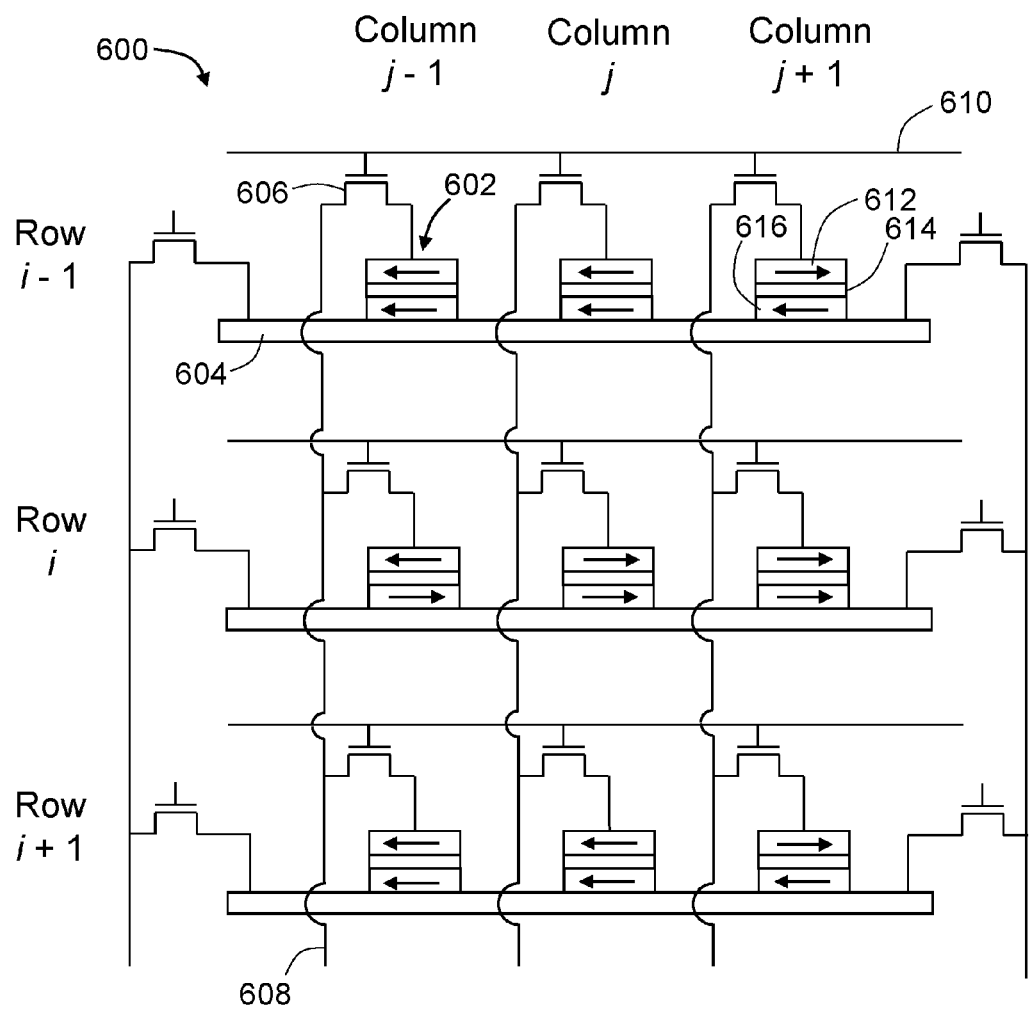
FIG. 10 is a schematic view of the CAM device of FIG. 8 showing a magnetization configuration after the pseudo-invariable magnetization direction of the magnetic comparison layer structure for a row of memory cells is switched.

When the CAM device 600 receives a search word as an input, for example (010), appropriate currents will flow in transverse polarizing lines 604 of rows i−1, i, and i+1 to switch the magnetization directions of the magnetic comparison layer structures 616 coupled thereto as illustrated in FIG. 10. Since the first and third entries of the search word is "0" or the minimum resistance state, the magnetization directions of the magnetic comparison layer structures 616 in rows i−1 and i+1 will be pointed to the left. Conversely, the magnetization directions of the magnetic comparison layer structures 616 in rows i are reoriented to the right because the second entry of the search word is "1". A match in data occurs if the magnetization directions of the magnetic free layer structure 612 and the magnetic comparison layer structure 616 are oriented in the same direction, resulting in the respective MTJ being in the low resistance state. Therefore, the stored word of a column of memory cells whose MTJs 602 are all in the low resistance state provides a match to the search word. For example, since all MTJs 602 in column j are in the low resistance state as shown in FIG. 10, the stored word of (010) in column j provides a match to the search word of (010). Therefore, the CAM device 600 will return an output of column j after receiving a search word of (010) in the above example. After the comparison operation, the magnetization directions of all magnetic comparison layers 616 may be reoriented to the same initial direction as shown in FIG. 9.

The device 600 of FIG. 8 may also be used as a self-referenced memory. The MTJs 602 of the device 600 may have an exemplary magnetization configuration as shown in FIG. 9. To determine the resistance state of a memory cell, say the cell located at row i and column j, by the self-referenced method, the initial voltage of the cell located at row i and column j is measured by selecting one of the word lines 610 at row i and one of the bit/source lines 608 at column j, and optionally one of the transverse polarizing lines 604 at row i. After measurement of the initial cell voltage by passing a read current through the cell, the magnetization direction of the magnetic comparison layer structure 616 for all memory cells disposed at row i is switched to opposite direction as shown in FIG. 10 by a current passing through one of the transverse polarizer lines 604 located at row i. The voltage of the cell located at row i and column j is then measured again and compared with the initial voltage reading. A voltage increase means the memory cell was originally in the low resistance state. Conversely, a voltage decrease means the memory cell was originally in the high resistance state. For the memory cell located at row i and column j, the initial resistance state is high and the subsequent resistance state is low, resulting in decrease in the cell voltage. After the voltages are compared, another current passing through the transverse polarizing line located at row i with opposite direction may switch the magnetic comparison layer structure 616 for all memory cells located at row i to the original configuration as shown in FIG. 9.

Figure 11:
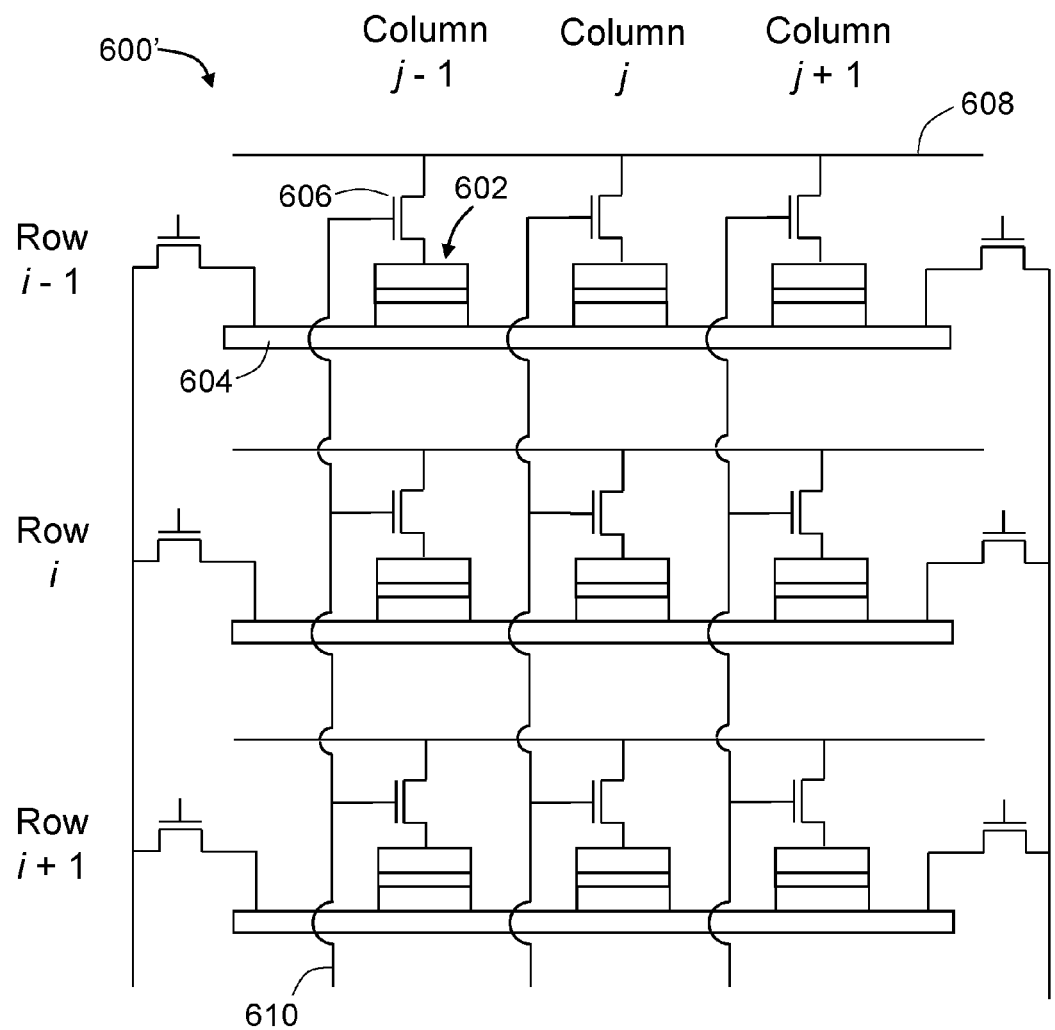
FIG. 11 is a schematic view of a CAM device incorporating an array of spin-oribitronics devices in accordance with another embodiment of the present invention.

It should be noted that the wiring layout of the CAM device 600 may be altered without affecting the device performance. For example, the orientations of the word lines 610 and the bit/source lines 608 in FIG. 8 may be swapped, resulting in another embodiment as illustrated in FIG. 11. The CAM device 600' of FIG. 11 includes an array of magnetic tunnel junctions (MTJs) 602 arranged in rows and columns with each row of MTJs 602 coupled to one of a plurality of transverse polarizing lines 604 that may also function as a bit or source line; an array of transistors 606 arranged in rows and columns with each row of transistors 606 coupled to one of a plurality of bit/source lines 608 at one end and a respective row of MTJs 602 at the other end; and a plurality of word lines 610 with each word line couples to gates of a respective column of transistors 606. Each of the MTJs 602 includes a magnetic free layer structure, an insulating tunnel junction layer, and a magnetic comparison layer structure coupled to a respective one of the transverse polarizing lines 604 as shown in FIGS. 5, 7A, and 7B. Each of the MTJs 602 may further include other layers, such as a magnetic reference structure separated from the magnetic free layer structure by a second insulating tunnel junction layer as illustrated in FIGS. 3, 6A, and 6B. The magnetic layers of the MTJs 602 may have in-plane magnetization (FIGS. 3 and 5) or perpendicular magnetization (FIGS. 6A, 6B, 7A, and 7B). For perpendicularly magnetized MTJs, an optional magnetic field layer may be included to facilitate switching of the magnetic comparison layer structure as shown in FIGS. 6A, 6B, 7A, and 7B. Any of the above-described orbitronics devices 100, 200, 300, 300', 400, and 400' may be used in the CAM device 600 or 600'.

Figure 12:
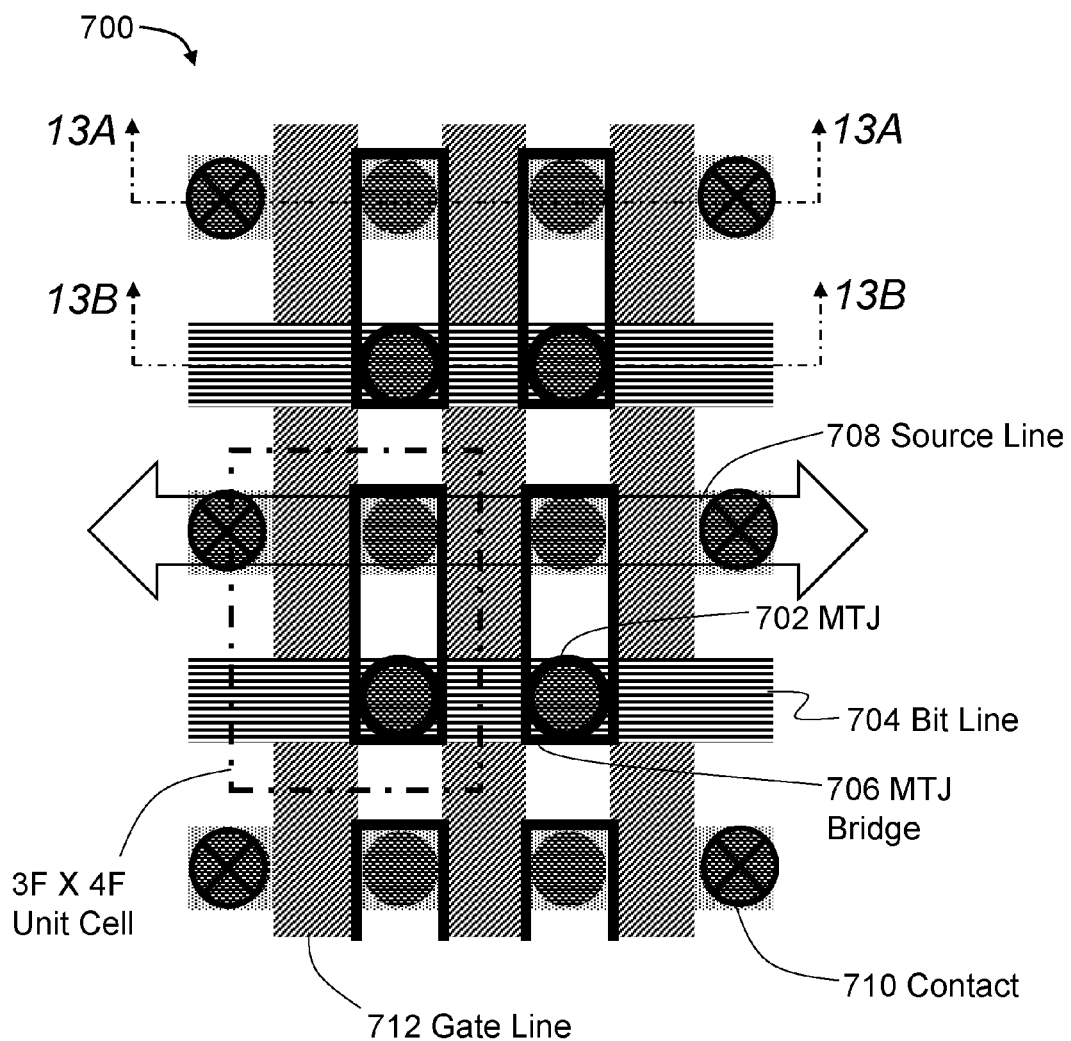
FIG. 12 is a planar top view of an exemplary device structure corresponding to the CAM device of FIG. 11.

The CAM device 600' of FIG. 11 may be fabricated on a substrate in accordance with an embodiment of the present invention. FIG. 12 shows a top planar view of the structure of an exemplary CAM device 700 formed on a substrate. The device 700 of FIG. 12 comprises a plurality of MTJs 702 formed on a plurality of bit lines 704 extending along a first direction with each MTJ coupled to an MTJ bridge 706 thereon; a plurality of source lines 708 coupled to rows of contacts 710 therebeneath along the first direction; and a plurality of gate lines 712 formed between the contacts 710 along a second direction that is perpendicular to the first direction. The device 700 has unit cell dimensions of 3F×4F. The contacts 710 are coupled to transistors formed therebeneath as exposed by the cross sectional views of FIGS. 13A and 13B, which are cut along one of the source lines 708 and one of the bit lines 704, respectively.

Figure 13A:
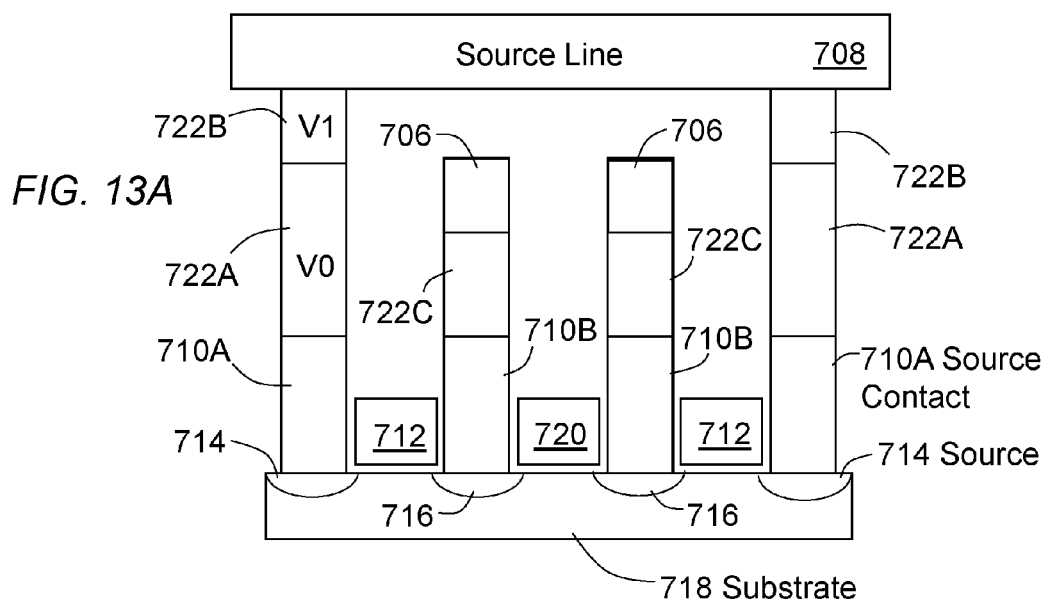
FIGS. 13A and 13B are cross sectional views corresponding to the exemplary device structure of FIG. 12.

FIG. 13A is a cross sectional view illustrating the structure of the transistor. Each transistor for selecting MTJ comprises one of sources 714 and one of drains 716 formed in a semiconductor substrate 718 and one of the gate lines 712 formed on the substrate 718 between the respective source 714 and the drain 716. The gate lines 712 function as word lines, while isolation gate lines 720 are used to electrically isolate adjacent transistors. Source contacts 710A and drain contacts 710B are formed on top of sources 714 and drains 716, respectively. Source contacts 710A are connected to one of the source lines 708 thereabove through one or more via studs 722A-722B. Drain contacts 710B are connected to the MTJ bridges 706 thereabove through one or more via studs 722C. The MTJ bridges 706 extend along the second direction and connect to the MTJs 702 therebeneath at the other end as illustrated in FIG. 13B.

Figure 13B:
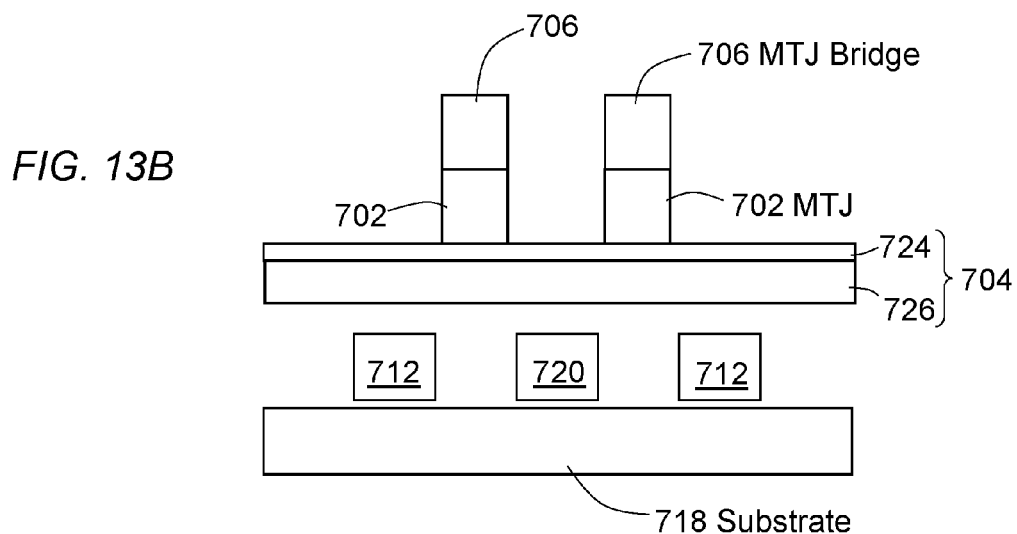

With continuing reference to FIG. 13B, the MTJs 702 are formed on top of one of a plurality of transverse polarizing layers 724, which is formed on top of one of a plurality of conductor layers 726. The transverse polarizing layers 724 and the conductor layers 726 collectively form the bit lines 704. In an alternative embodiment, the bit lines 704 may be made of only the transverse polarizing layers 724.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

What is claimed is:

1. A spin-orbitronics device comprising:
   an array of magnetic tunnel junctions (MTJs) with each of said MTJs coupled to a respective one of a plurality of selection transistors;
   a plurality of transverse polarizing lines with each of said transverse polarizing lines coupled to a row of said MTJs along a first direction;
   a plurality of word lines with each of said word lines coupled to gates of a row of said selection transistors along a second direction; and
   a plurality of conductive lines that function as bit lines or source lines, each of said conductive lines coupled to a row of said selection transistors along a direction that is substantially perpendicular to said second direction,
   wherein each of said MTJs comprises:
      a magnetic comparison layer structure having a pseudo-invariable magnetization direction formed adjacent to a respective one of said transverse polarizing lines, said pseudo-invariable magnetization direction being switched between two stable states by passing a comparison current through said respective one of said transverse polarizing lines along a direction that is substantially parallel to said transverse polarizing lines;
      a magnetic free layer structure having a variable magnetization direction that is switched by a switching current passing between said magnetic comparison layer structure and said magnetic free layer structure; and
      an insulating tunnel junction layer interposed between said magnetic comparison layer structure and said magnetic free layer structure.

2. The spin-orbitronics device of claim 1, wherein said first direction and said second direction are substantially perpendicular to each other.

3. The spin-orbitronics device of claim 1, wherein said first direction and said second direction are substantially parallel to each other.

4. The spin-orbitronics device of claim 1, wherein said transverse polarizing lines is made of a heavy metal.

5. The spin-orbitronics device of claim 1, wherein said transverse polarizing lines is made of a topological insulator.

6. The spin-orbitronics device of claim 1, wherein said magnetic comparison layer structure has a higher coercivity than said magnetic free layer structure.

7. The spin-orbitronics device of claim 1, wherein said pseudo-invariable magnetization direction of said magnetic comparison layer structure and said variable magnetization direction of said magnetic free layer structure are substantially parallel to layer planes thereof.

8. The spin-orbitronics device of claim 1, wherein each of said MTJs further comprises a magnetic field layer structure having an in-plane invariable magnetization direction separated from said magnetic free layer structure by a non-magnetic spacer layer.

9. The spin-orbitronics device of claim 1, wherein each of said MTJs further comprises a magnetic field layer structure having an in-plane invariable magnetization direction formed adjacent to said respective one of said transverse polarizing lines opposite said magnetic comparison layer structure.

10. A spin-orbitronics device comprising:
- an array of magnetic tunnel junctions (MTJs) with each of said MTJs coupled to a respective one of a plurality of selection transistors;
- a plurality of transverse polarizing lines with each of said transverse polarizing lines coupled to a row of said MTJs along a first direction;
- a plurality of word lines with each of said word lines coupled to gates of a row of said selection transistors along a second direction; and
- a plurality of conductive lines that function as bit lines or source lines, each of said conductive lines coupled to a row of said selection transistors along a direction that is substantially perpendicular to said second direction, wherein each of said MTJs comprises:
- a magnetic comparison layer structure having a pseudo-invariable magnetization direction formed adjacent to a respective one of said transverse polarizing lines, said pseudo-invariable magnetization direction being switched by passing a comparison current through said respective one of said transverse polarizing lines along a direction that is substantially parallel to said transverse polarizing lines;
- a magnetic free layer structure having a variable magnetization direction that is switched by a switching current passing between said magnetic comparison layer structure and said magnetic free layer structure; and
- an insulating tunnel junction layer interposed between said magnetic comparison layer structure and said magnetic free layer structure, wherein said pseudo-invariable magnetization direction is substantially perpendicular to a layer of said magnetic comparison layer structure and said variable magnetization direction is substantially perpendicular to a layer of said magnetic free layer structure.

11. The spin-orbitronics device of claim 10, wherein said first direction and said second direction are substantially perpendicular to each other.

12. The spin-orbitronics device of claim 10, wherein said transverse polarizing lines is made of a heavy metal.

13. The spin-orbitronics device of claim 10, wherein said transverse polarizing lines is made of a topological insulator.

14. The spin-orbitronics device of claim 10, wherein said magnetic comparison layer structure has a higher coercivity than said magnetic free layer structure.

15. The spin-orbitronics device of claim 10, wherein each of said MTJs further comprises a magnetic field layer structure having an in-plane invariable magnetization direction separated from said magnetic free layer structure by a non-magnetic spacer layer.

* * * * *